(12) United States Patent
Hwang et al.

(10) Patent No.: US 12,282,388 B2
(45) Date of Patent: Apr. 22, 2025

(54) MEMORY MODULE FOR DETECTING AND CORRECTING A ROW DIRECTION ERROR AND A COLUMN DIRECTION ERROR

(71) Applicant: SK hynix Inc., Icheon-si (KR)

(72) Inventors: Yong Wan Hwang, Icheon-si (KR); Tae Woong Ha, Icheon-si (KR); Kwang Ho Choi, Icheon-si (KR); Moon Hyeok Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/357,930

(22) Filed: Jul. 24, 2023

(65) Prior Publication Data

US 2024/0281326 A1 Aug. 22, 2024

(30) Foreign Application Priority Data

Feb. 16, 2023 (KR) .................. 10-2023-0020397

(51) Int. Cl.
*G06F 11/00* (2006.01)
*G06F 11/10* (2006.01)
*G11C 11/408* (2006.01)
*G11C 11/4091* (2006.01)

(52) U.S. Cl.
CPC ...... *G06F 11/1068* (2013.01); *G11C 11/4087* (2013.01); *G11C 11/4091* (2013.01)

(58) Field of Classification Search
CPC ............ G06F 11/1068; G06F 11/1076; G06F 11/108; G06F 11/1032
See application file for complete search history.

(56) References Cited

U.S. PATENT DOCUMENTS

| | | | |
|---|---|---|---|
| 9,588,840 B2* | 3/2017 | Chung | G06F 11/1048 |
| 10,404,286 B2* | 9/2019 | Sin | G06F 11/1048 |
| 11,296,729 B2* | 4/2022 | Kale | H03M 13/2906 |
| 11,829,245 B2* | 11/2023 | Kaynak | G06F 11/1048 |
| 2017/0091025 A1* | 3/2017 | Ahn | G06F 11/1024 |
| 2017/0123903 A1* | 5/2017 | Eguchi | G06F 11/106 |

FOREIGN PATENT DOCUMENTS

| | | |
|---|---|---|
| KR | 10-2018-0040474 A | 4/2018 |
| KR | 10-2021-0075930 A | 6/2021 |

* cited by examiner

*Primary Examiner* — Esaw T Abraham

(57) ABSTRACT

A memory module includes a plurality of first memory chips and a second memory chip. Raw data is stored in the plurality of first memory chips. Parity data generated based on the raw data is stored in the second memory chip. Each of the first memory chips and the second memory chip is configured to exchange data with a controller based on a burst length unit. The second memory chip stores a first parity data generated from the raw data by a first error correction method, and stores a second parity data generated from the raw data and the first parity data by a second error correction method.

12 Claims, 12 Drawing Sheets

FIG. 6

|    |     | BL0 | BL1 | BL2 | BL3 | BL4 | BL5 | BL6 | BL7 | BL8 | BL9 | BL10 | BL11 | BL12 | BL13 | BL14 | BL15 |
|----|-----|-----|-----|-----|-----|-----|-----|-----|-----|-----|-----|------|------|------|------|------|------|
| #1 | DQ0 | | | | | | | | | | | | | | | | |
|    | DQ1 | | | | | | | | | | | | | | | | |
|    | DQ2 | | | | | | | | | | | | | | | | |
|    | DQ3 | | | | | | | | | | | | | | | | |
|    | DQ4 | | | | | | | | | | | | | | | | |
|    | DQ5 | | | | | | | | | | | | | | | | |
|    | DQ6 | | | | | | | | | | | | | | | | |
|    | DQ7 | | | | | | | | | | | | | | | | |
| #2 | DQ0 | | | | | | | | | | | | | | | | |
|    | DQ1 | | | | | | | | | | | | | | | | |
|    | DQ2 | | | | | | | | | | | | | | | | |
|    | DQ3 | | | | | | | | | | | | | | | | |
|    | DQ4 | | | | | | | | | | | | | | | | |
|    | DQ5 | | | | | | | | | | | | | | | | |
|    | DQ6 | | | | | | | | | | | | | | | | |
|    | DQ7 | | | | | | | | | | | | | | | | |
| #3 | DQ0 | | | | | | | | | | | | | | | | |
|    | DQ1 | | | | | | | | | | | | | | | | |
|    | DQ2 | | | | | | | | | | | | | | | | |
|    | DQ3 | | | | | | | | | | | | | | | | |
|    | DQ4 | | | | | | | | | | | | | | | | |
|    | DQ5 | | | | | | | | | | | | | | | | |
|    | DQ6 | | | | | | | | | | | | | | | | |
|    | DQ7 | | | | | | | | | | | | | | | | |
| #4 | DQ0 | | | | | | | | | | | | | | | | |
|    | DQ1 | | | | | | | | | | | | | | | | |
|    | DQ2 | | | | | | | | | | | | | | | | |
|    | DQ3 | | | | | | | | | | | | | | | | |
|    | DQ4 | | | | | | | | | | | | | | | | |
|    | DQ5 | | | | | | | | | | | | | | | | |
|    | DQ6 | | | | | | | | | | | | | | | | |
|    | DQ7 | | | | | | | | | | | | | | | | |
| #5 | DQ0 | | | | | | | | | | | | | | | | |
|    | DQ1 | | | | | | | | | | | | | | | | |
|    | DQ2 | | | | | | | | | | | | | | | | |
|    | DQ3 | | | | | | | | | | | | | | | | |
|    | DQ4 | | | | | | | | | | | | | | | | |
|    | DQ5 | | | | | | | | | | | | | | | | |
|    | DQ6 | | | | | | | | | | | | | | | | |
|    | DQ7 | | | | | | | | | | | | | | | | |

FIG. 7

|    |     | BL0 | BL1 | BL2 | BL3 | BL4 | BL5 | BL6 | BL7 |
|----|-----|-----|-----|-----|-----|-----|-----|-----|-----|
| #1 | DQ0 |     |     |     |     |     |     |     |     |
|    | DQ1 |     |     |     |     |     |     |     |     |
|    | DQ2 |     |     |     |     |     |     |     |     |
|    | DQ3 |     |     |     |     |     |     |     |     |
|    | DQ4 |     |     |     |     |     |     |     |     |
|    | DQ5 |     |     |     |     |     |     |     |     |
|    | DQ6 |     |     |     |     |     |     |     |     |
|    | DQ7 |     |     |     |     |     |     |     |     |

|  |  | BL0 | BL1 | BL2 | BL3 | BL4 | BL5 | BL6 | BL7 | BL8 | BL9 | BL10 | BL11 | BL12 | BL13 | BL14 | BL15 |
|---|---|---|---|---|---|---|---|---|---|---|---|---|---|---|---|---|---|
| #1 | DQ0 | | | | | | | | | | | | | | | | |
| | DQ1 | | | | | | | | | | | | | | | | |
| | DQ2 | | | | | | | | | | | | | | | | |
| | DQ3 | | | | | | | | | | | | | | | | |
| | DQ4 | | | | | | | | | | | | | | | | |
| | DQ5 | | | | | | | | | | | | | | | | |
| | DQ6 | | | | | | | | | | | | | | | | |
| | DQ7 | | | | | | | | | | | | | | | | |
| #2 | DQ0 | | | | | | | | | | | | | | | | |
| | DQ1 | | | | | | | | | | | | | | | | |
| | DQ2 | | | | | | | | | | | | | | | | |
| | DQ3 | | | | | | | | | | | | | | | | |
| | DQ4 | | | | | | | | | | | | | | | | |
| | DQ5 | | | | | | | | | | | | | | | | |
| | DQ6 | | | | | | | | | | | | | | | | |
| | DQ7 | | | | | | | | | | | | | | | | |
| #3 | DQ0 | | | | | | | | | | | | | | | | |
| | DQ1 | | | | | | | | | | | | | | | | |
| | DQ2 | | | | | | | | | | | | | | | | |
| | DQ3 | | | | | | | | | | | | | | | | |
| | DQ4 | | | | | | | | | | | | | | | | |
| | DQ5 | | | | | | | | | | | | | | | | |
| | DQ6 | | | | | | | | | | | | | | | | |
| | DQ7 | | | | | | | | | | | | | | | | |
| #4 | DQ0 | | | | | | | | | | | | | | | | |
| | DQ1 | | | | | | | | | | | | | | | | |
| | DQ2 | | | | | | | | | | | | | | | | |
| | DQ3 | | | | | | | | | | | | | | | | |
| | DQ4 | | | | | | | | | | | | | | | | |
| | DQ5 | | | | | | | | | | | | | | | | |
| | DQ6 | | | | | | | | | | | | | | | | |
| | DQ7 | | | | | | | | | | | | | | | | |
| #5 | DQ0 | | | | | | | | | | | | | | | | |
| | DQ1 | | | | | | | | | | | | | | | | |
| | DQ2 | | | | | | | | | | | | | | | | |
| | DQ3 | | | | | SECDED PARITY DATA | | | | | | | | | | | |
| | DQ4 | | | | | | | | | | | | | | | | |
| | DQ5 | | | | | | | | | | | | | | | | |
| | DQ6 | | | | | | | | | | | | | | | | |
| | DQ7 | | | | | | | | | | | | | | | | |

FIG. 14

| | | BL0 | BL1 | BL2 | BL3 | BL4 | BL5 | BL6 | BL7 | BL8 | BL9 | BL10 | BL11 | BL12 | BL13 | BL14 | BL15 |
|---|---|---|---|---|---|---|---|---|---|---|---|---|---|---|---|---|---|
| #1 | DQ0–DQ7 | | | | | | | | RAW DATA | | | | | | | | |
| #2 | DQ0–DQ7 | | | | | | | | RAW DATA | | | | | | | | |
| #3 | DQ0–DQ7 | | | | | | | | RAW DATA | | | | | | | | |
| #4 | DQ0–DQ7 | | | | | | | | RAW DATA | | | | | | | | |
| #5 | DQ0 | | | | | | | | RS PARITY DATA | | | | | | | | |
| | DQ1–DQ7 | | | | | | | | SECDED PARITY DATA | | | | | | | | |

MEMORY MODULE FOR DETECTING AND CORRECTING A ROW DIRECTION ERROR AND A COLUMN DIRECTION ERROR

CROSS-REFERENCE TO RELATED APPLICATION

The present application claims priority under 35 U.S.C. § 119(a) to Korean patent application number 10-2023-0020397 filed on Feb. 16, 2023, in the Korean Intellectual Property Office, the entire disclosure of which is incorporated by reference herein.

BACKGROUND

1. Field of Invention

The present disclosure relates to an electronic device, and more particularly to a memory module having an improved error correction function.

2. Description of Related Art

A memory module is configured to store data input by an external host device and to provide the stored data when requested by the external host device. Errors may occur when the data is input to the memory module, while the memory module is storing the data, or when the data is output from the memory module.

An error occurring in the data may cause a system error in the external host device using the data. In order to prevent such a system error, the external host device detect the error in the data output from the memory module and correct the detected error.

SUMMARY

An embodiment of the present disclosure provides a memory module capable of detecting and correcting both a row direction error and a column direction error.

According to an aspect of the present disclosure, a memory module includes a plurality of first memory chips and a second memory chip. Raw data is stored in the plurality of first memory chips. Parity data generated based on the raw data is stored in the second memory chip. Each of the first memory chips and the second memory chip is configured to exchange data with a controller based on a burst length unit. The second memory chip stores a first parity data generated from the raw data by a first error correction method, and stores a second parity data generated from the raw data and from the first parity data by a second error correction method.

In an embodiment, the first error correction method may use a Reed-Solomon (RS) code.

In an embodiment, the second error correction method may be a single error correction double error detection (SECDED) method.

The present technology may provide a memory module capable of detecting and correcting both of a row direction error and a column direction error.

BRIEF DESCRIPTION OF THE DRAWINGS

FIG. 6 is a diagram illustrating an example of a data block in which each of first to fifth memory chips 100*a* to 100*e* exchanges data with a controller according to an embodiment of the present disclosure.

FIG. 7 is a diagram illustrating a type of data stored in each of first to fifth memory chips according to an embodiment of the present disclosure.

FIG. 12 is a diagram illustrating a process of generating and storing RS parity data in an ECC memory chip according to an embodiment of the present disclosure.

FIG. 13 is a diagram illustrating a process of generating and storing SECDED parity data from raw data and RS parity data according to an embodiment of the present disclosure.

FIG. 14 is a diagram illustrating data stored in each memory chip of a memory module according to an embodiment of the present disclosure.

DETAILED DESCRIPTION

Specific structural or functional descriptions of embodiments according to the concepts that are disclosed in the present specification or application are illustrated only to describe the embodiments according to the concepts of the present disclosure. The embodiments according to the concepts of the present disclosure may be carried out in various forms and should not be construed as being limited to the embodiments described in the present specification or application.

Figure 1:
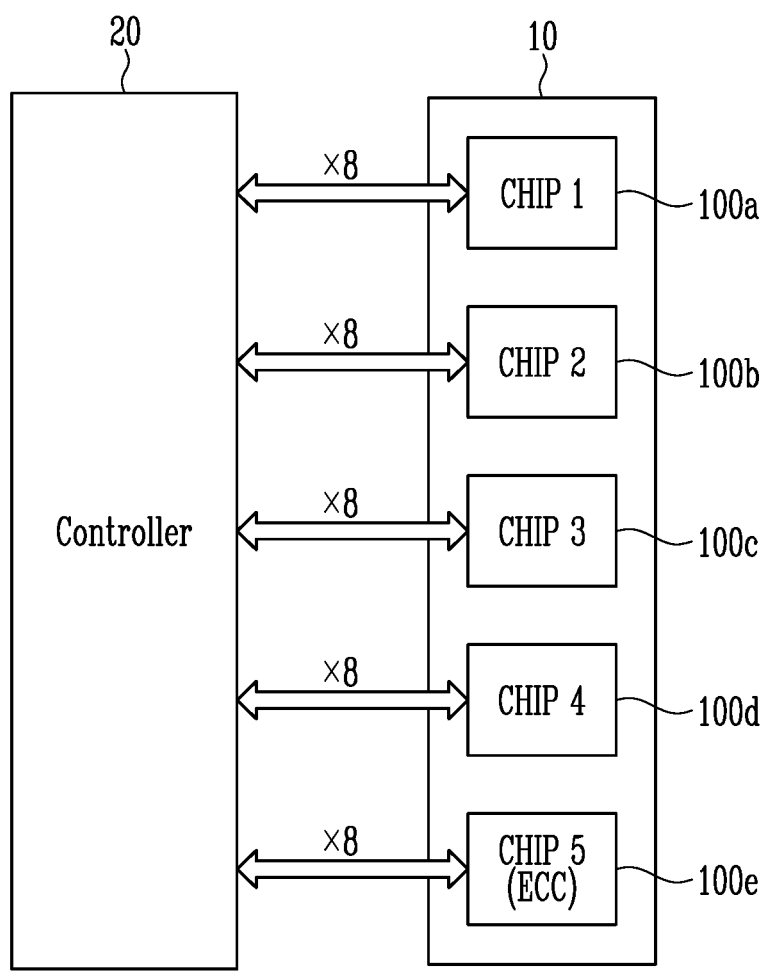
FIG. 1 is a block diagram illustrating a memory system according to an embodiment of the present disclosure.

FIG. 1 is a block diagram illustrating a memory system according to an embodiment of the present disclosure. Referring to FIG. 1, a memory system may include a memory module 10 and a controller 20.

The memory module 10 may include a plurality of memory chips 100*a* to 100*e*. In FIG. 1, the memory module 10 includes five memory chips 100*a* to 100*e*, but the present disclosure is not limited thereto and various numbers of memory chips may be included in the memory module as necessary.

The memory chips 100*a* to 100*e* may communicate with the controller 20 through corresponding connectors. For example, the memory chips 100*a* to 100*e* may communicate data signals DQ (refer to FIG. 2) and data strobe signals DQS (refer to FIG. 2) with the controller 20.

In an embodiment, the controller 20 may be included in an external host device. The memory chips 100*a* to 100*e* may simultaneously receive the data signals DQ and write the received data signals DQ according to a request of the external host device.

Each of the memory chips 100a to 100e may be a Double Data Rate 5 (DDR5) Synchronous Dynamic Random-Access Memory (SDRAM). The memory chips 100a to 100e may communicate with the controller 20 according to a standard for a Dual In-line Memory Module (DIMM), more specifically, a DDR5 SDRAM DIMM.

The memory chips 100a to 100e may sequentially receive or sequentially output the data signals DQ as many times as a burst length (BL). For example, depending on the standard of the DDR5 SDRAM DIMM, the burst length (BL) may be 16.

In FIG. 1, first to fourth memory chips 100a to 100d may be memory chips for storing raw data, and a fifth memory chip 100e may be a memory chip for error correction. The controller 20 may control an operation of the memory chips 100a to 100e in the memory module 10 to store the raw data in the first to fourth memory chips 100a to 100d and write an error correction code (ECC) in the fifth memory chip 100e.

Figure 2:
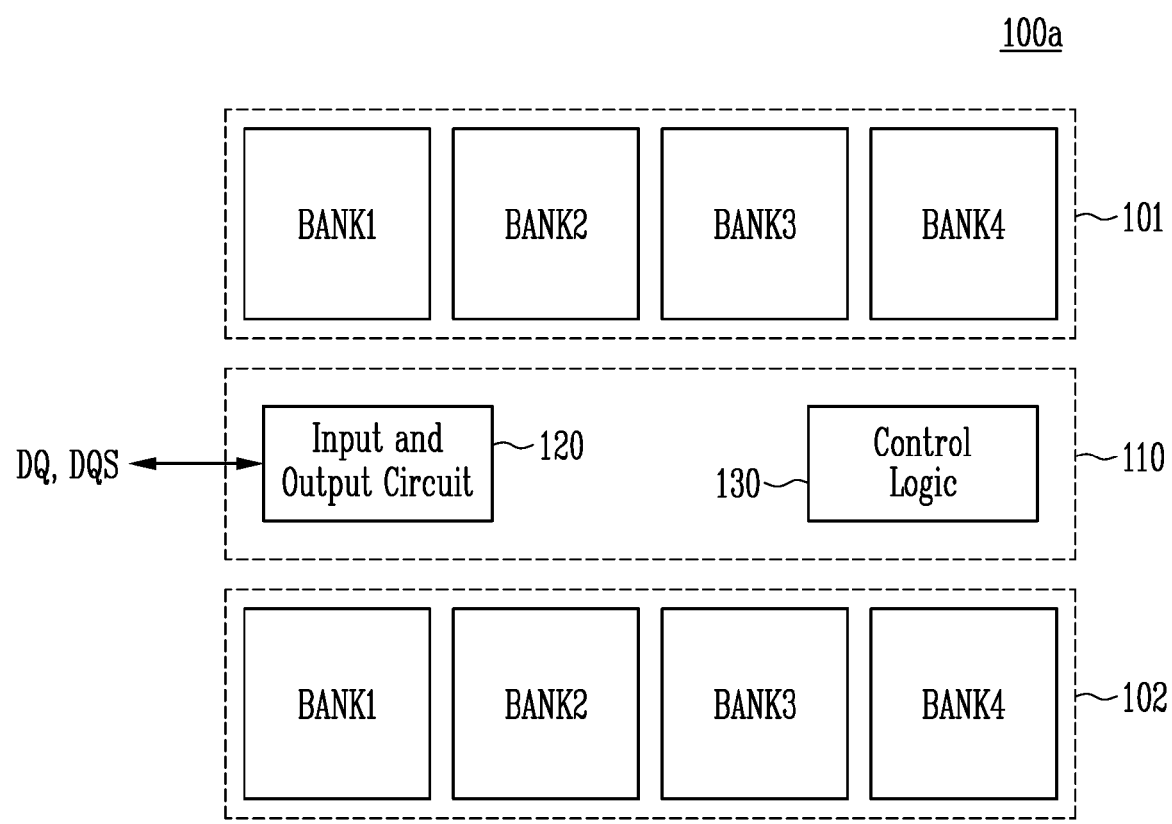
FIG. 2 is a block diagram illustrating an example of a first memory chip shown in FIG. 1.

FIG. 2 is a block diagram illustrating an example of a first memory chip 100a shown in FIG. 1. The second to fifth memory chips 100b to 100e may have the same structures as the first memory chip 100a and operate identically to the first memory chip 100a.

Referring to FIGS. 1 and 2, the first memory chip 100a may include a first bank group 101 and a second bank group 102. Each of the first bank group 101 and the second bank group 102 may include first to fourth banks BANK1 to BANK4. The first to fourth banks BANK1 to BANK4 of the first bank group 101 and the second bank group 102 may have the same structures and operate identically.

Each of the first to fourth banks BANK1 to BANK4 may include memory cells. The memory cells may be used to store raw data or an error correction code transferred from the controller 20.

The first memory chip 100a may further include a peripheral circuit 110. The peripheral circuit 110 may receive a control signal from the controller 20. The peripheral circuit 110 may receive a command, an address, and a clock signal from the controller 20. The peripheral circuit 110 may select a bank, indicated by the address, from among the first to fourth banks BANK1 to BANK4 of the first bank group 101 and the second bank group 102.

The peripheral circuit 110 may control the selected bank to perform an operation indicated by the command, for example, a write operation or a read operation, on memory cells of the selected bank indicated by the address. The peripheral circuit 110 may communicate the data signals DQ and the data strobe signals DQS with the controller 20. The data strobe signals DQS may be used to transfer timings for latching the data signals DQ.

The peripheral circuit 110 may include an input and output circuit 120 configured to exchange the data signals DQ and the data strobe signals DQS with the controller 20. The peripheral circuit 110 may further include a control logic 130 configured to control the selected bank in response to the command, the address, the clock signal, and the control signals. The peripheral circuit 110 may further include the input and output circuit 120 configured to communicate the data signals DQ and the data strobe signals DQS with the controller 20 under control of the control logic 130.

Although the number of bank groups and the number of banks are limited in FIG. 2, the technical spirit of the present disclosure is not limited to the number of banks shown in FIG. 2. The number of bank groups and number of banks may be changed as applicable.

Figure 3:
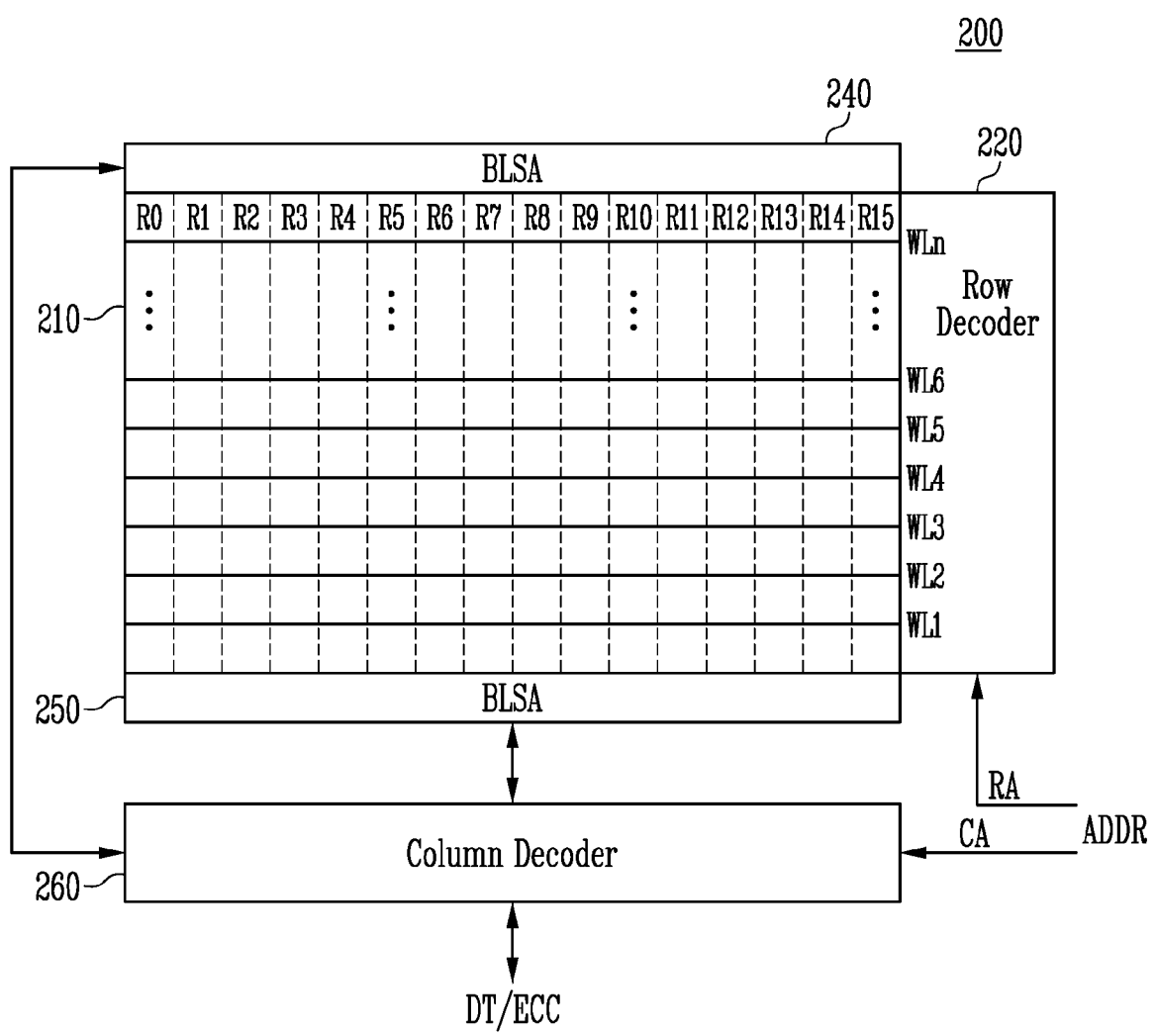
FIG. 3 is a diagram illustrating a bank according to an embodiment of the present disclosure.

FIG. 3 is a diagram illustrating a bank according to an embodiment of the present disclosure. For example, a bank 200 may correspond to any one of the first to fourth banks BANK1 to BANK4 of the first bank group 101 and of the second bank group 102 shown in FIG. 2.

Referring to FIGS. 1 to 3, the bank 200 may include a memory cell array 210, a row decoder 220, a first bit line sense amplifier 240, and a second bit line sense amplifier 250, and a column decoder 260.

The memory cell array 210 may include memory cells arranged along a row direction and a column direction. The memory cell array 210 may be divided into zero-th to fifteenth regions R0 to R15. The zero-th to fifteenth regions R0 to R15 may correspond to a burst length BL. For example, when the burst length BL is 8, the number of regions may be 8. When the burst length BL is 32, the number of regions may be 32.

The row decoder 220 may be connected to rows of the memory cells through word lines WL1 to WLn (where n is a positive integer greater than 1). The row decoder 220 may receive a row address RA among addresses ADDR and select any one of the first to n-th word lines WL1 to WLn corresponding to the row address RA. For example, the row decoder 220 may apply an activation voltage (for example, a positive voltage) to the selected word line.

The first bit line sense amplifier 240 and the second bit line sense amplifier 250 may be connected to columns of the memory cells through the bit lines. The first bit line sense amplifier 240 and the second bit line sense amplifier 250 may be connected to different bit lines. For example, the first bit line sense amplifier 240 may be connected to even (or odd)-numbered bit lines along the row direction, and the second bit line sense amplifier 250 may be connected to odd (or even)-numbered bit lines along the row direction.

The first bit line sense amplifier 240 and the second bit line sense amplifier 250 may apply voltages to the bit lines or sense voltages of the bit lines. By adjusting or sensing the voltages of bit lines, the first bit line sense amplifier 240 and the second bit line sense amplifier 250 may perform write operations or read operations on the memory cells of the selected row.

The column decoder 260 may receive a column address CA among the addresses ADDR. The column decoder 260 may electrically connect some of the bit lines to the peripheral circuit 110 in response to receiving the column address CA. For example, the column decoder 260 may sequentially select the zero-th to fifteenth regions R0 to R15 and output data read from memory cells of a selected region in order to output data corresponding to the burst length BL of 16 or the error correction code ECC.

For example, the memory cell array 210 is shown as including zero-th to fifteenth regions R0 to R15. However, the memory cell array 210 may include a plurality of sub-arrays, and each sub-array may include zero-th to fifteenth regions R0 to R15. During a write operation or a read operation, one of the plurality of sub-arrays is selected, and a write operation or a read operation of a unit of a burst length BL may be performed in the zero-th to fifteenth regions R0 to R15 of the selected sub-array.

For example, the column decoder 260 has been described as being included in the bank 200. However, the column decoder 260 may be included in the peripheral circuit 110 instead of the bank 200. When the column decoder 260 is included in the peripheral circuit 110, the column decoder 260 may control an input of an output of data or an error correction code ECC for one bank selected from among the first to fourth banks BANK1 to BANK4 of the first bank group 101 and of the second bank group 102. That is, the column decoder 260 may be commonly provided with respect to the first to fourth banks BANK1 to BANK4 of the first bank group 101 and the second bank group 102.

Figure 4:
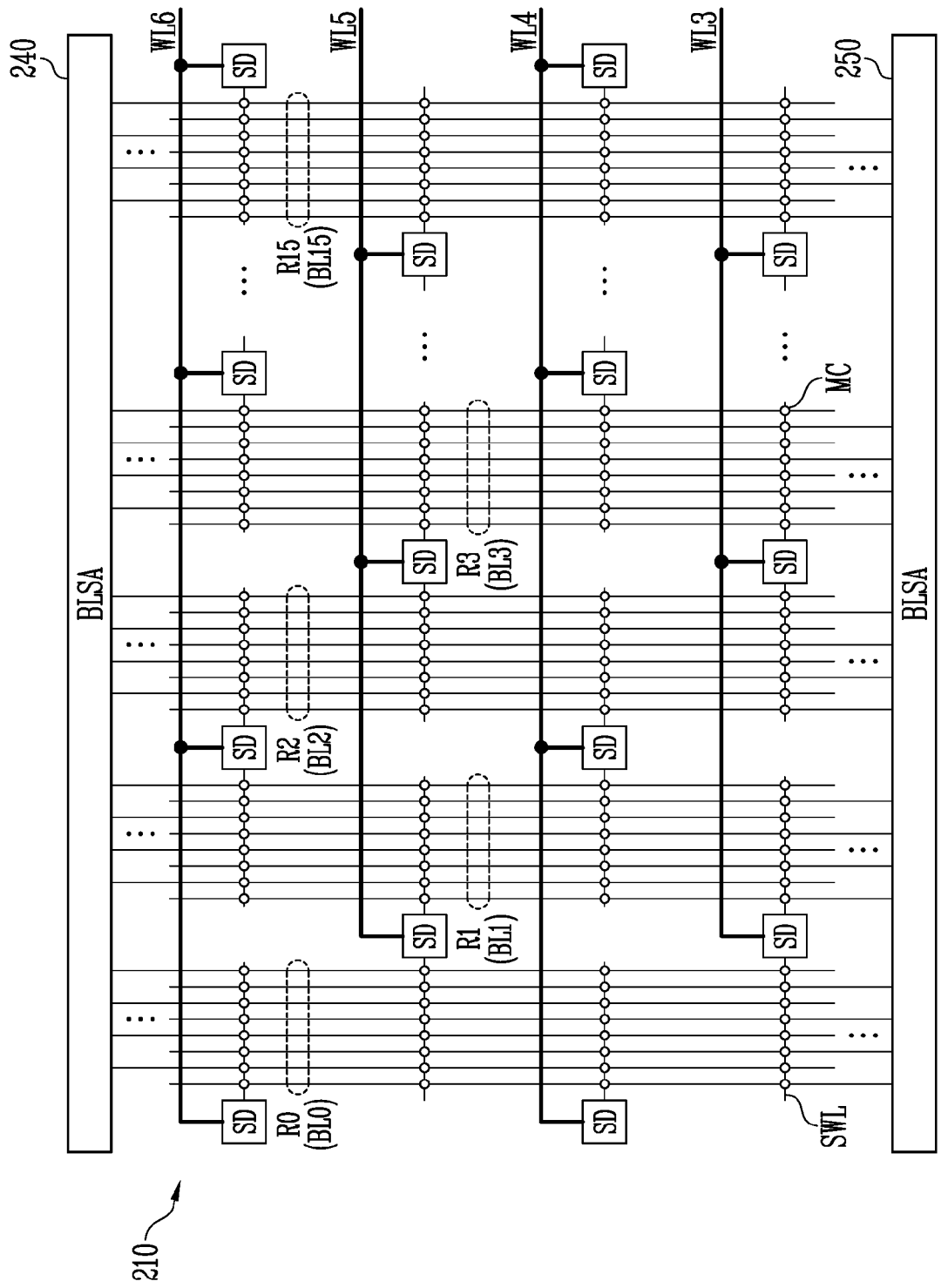
FIG. 4 is a diagram illustrating an example of a memory cell array of FIG. 3.

FIG. 4 is a diagram illustrating an example of a memory cell array of FIG. 3. Referring to FIGS. 1 to 4, a memory cell array 210 may include memory cells MC indicated by a circle. The memory cells MC may be connected to sub-word line drivers SD through sub-word lines SWL. The sub-word line drivers SD may be connected to word lines, for example, third to sixth word lines WL3 to WL6.

The zero-th to fifteenth regions R0 to R15 may correspond to a burst length BL of 16, respectively. Memory cells of the zero-th region R0 may correspond to a zero-th burst length BL0 among the burst length BL of 16. Memory cells of the first region R1 may correspond to a first burst length BL1 among the burst length BL of 16. The zero-th to fifteenth regions R0 to R15 may correspond to zero-th to fifteenth burst lengths BL0 to BL15, respectively.

In the zero-th region R0, memory cells MC corresponding to the fourth word line WL4 and the sixth word line WL6 may be connected to a right sub-word lines SWL of corresponding sub-word line drivers SD. Memory cells MC corresponding to the third word line WL3 and the fifth word line WL5 may be connected to left sub-word lines SWL of the corresponding sub-word line drivers SD.

During a write operation or a read operation, at least one of sub-word line drivers SD (or sub-word lines SWL) connected to a selected word line may be selected. The write operation or the read operation may be performed on the sub-word lines SWL connected to the selected at least one sub-word line driver SD or the memory cells MC connected to the selected at least one sub-word line SWL.

For example, decoding lines for selecting at least one of the sub-word line drivers SD or at least one of the sub-word lines SWL connected to the selected word line may be additionally provided. The decoding lines may be controlled by the row decoder 220 based on the row address RA. In order to avoid unnecessarily complicate the drawing, the decoding lines are omitted from FIG. 4.

That is, in the third to sixth word lines WL3 to WL6, the sub-word line drivers SD may be alternately disposed on a left side and a right side of the zero-th region R0 along the column direction. Similarly, in each of the first to fifteenth regions R1 to R15, the sub-word line drivers SD may be alternately disposed on a left side and a right side along the column direction.

In each of the zero-th to fifteenth regions R0 to R15, the first bit line sense amplifier 240 may be connected to even (or odd)-numbered bit lines. In each of the zero-th to fifteenth regions R0 to R15, the second bit line sense amplifier 250 may be connected to odd (or even)-numbered bit lines.

For example, eight memory cells MC may be connected to one sub-word line SWL. A program operation can be performed simultaneously on each of the memory cells MC connected to a sub-word line SWL. It is also possible to simultaneously perform a read operation on each of the memory cells MC connected to a sub-word line SWL. That is, the first memory chip 100a may receive or output 8 data signals DQ (for example, 8 bits) at a time.

For example, a plurality of memory cell groups may be connected to one sub-word line SWL. Each of the plurality of memory cell groups may include memory cells MC corresponding to the number of data signals DQ simultaneously received or output by the first memory chip 100a, such as for example, eight memory cells MC.

During the write operation or the read operation, one of the plurality of memory cell groups connected to one sub-word line SWL may be selected. The write operation or the read operation may be performed on memory cells of the selected memory cell group.

Figure 5:
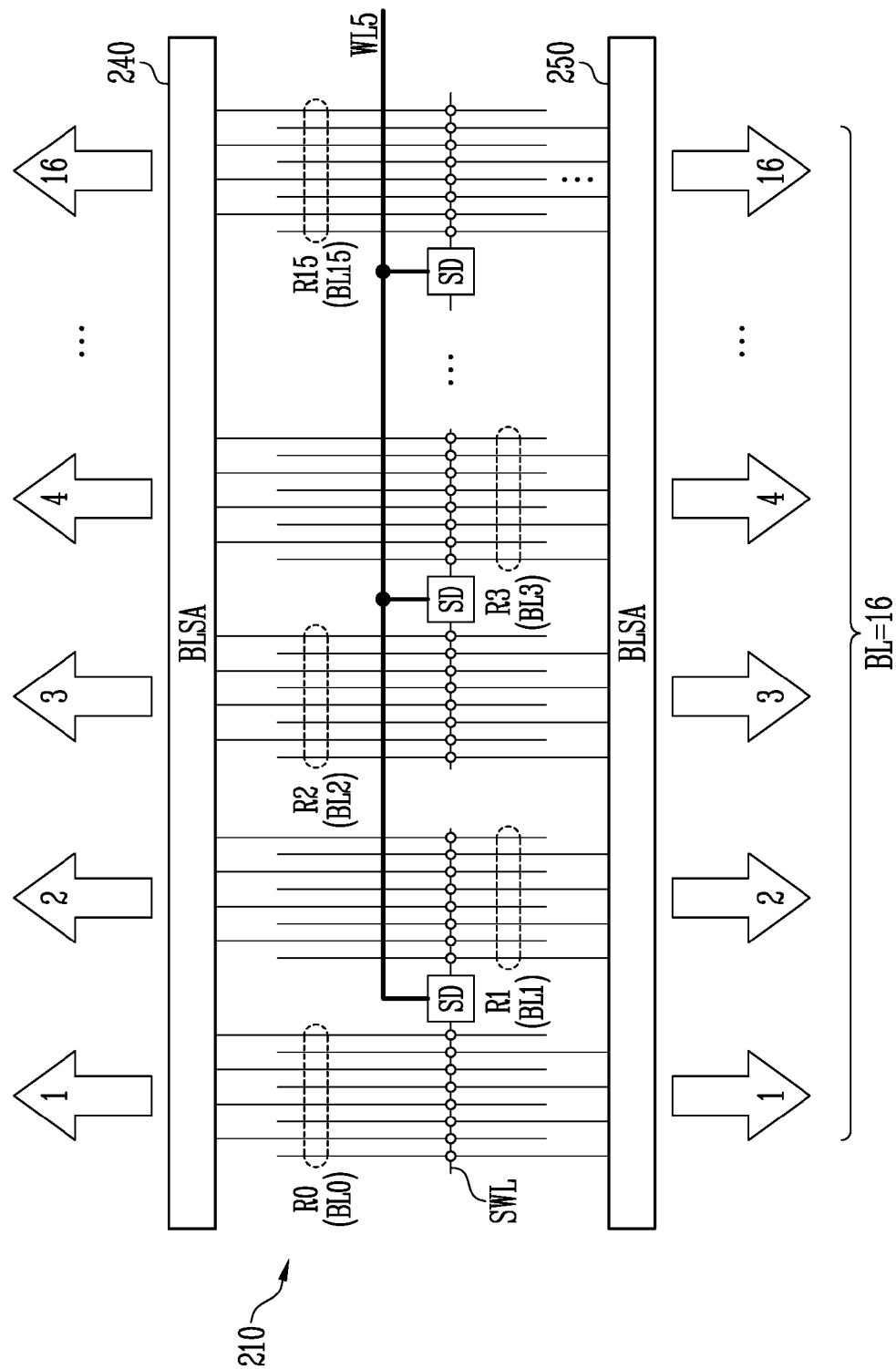
FIG. 5 is a diagram illustrating an example in which data or an error correction code ECC is read from a memory cell array during a read operation according to an embodiment of the present disclosure.

FIG. 5 is a diagram illustrating an example in which data or an error correction code ECC is read from a memory cell array during a read operation according to an embodiment of the present disclosure. Referring to FIGS. 1 to 5, the following description is directed to a selected fifth word line WL5.

At the zero-th burst length BL0, data or an error correction code ECC may be read from memory cells MC of a zero-th region R0 by a first bit line sense amplifier 240 and a second bit line sense amplifier 250. The read data or error correction code ECC may be simultaneously output from the first memory chip 100a as the data signals DQ.

Thereafter, in the first to fifteenth burst lengths BL1 to BL15, the data or the error correction codes ECC may be read from the first to fifteenth regions R1 to R15. The read data or error correction code ECC may be simultaneously output from the first memory chip 100a as the data signals DQ.

That is, the first memory chip 100a may output 8 data signals DQ 16 times. As the first memory chip 100a outputs the data signals DQ 16 times, the burst length BL of the first memory chip 100a may be 16.

The write operation is performed in a method similar to the read operation except that the first memory chip 100a receives the data signals DQ instead of outputting the data signals DQ and writes the data or the error correction code ECC to the memory cells MC. Therefore, an overlapping description of the write operation is omitted.

FIG. 6 is a diagram illustrating an example of a data block in which each of first to fifth memory chips exchanges data a controller according to an embodiment of the present disclosure. In FIG. 6, data blocks corresponding to respective first to fifth memory chips 100a to 100e are indicated as numbers 1 to 5 (#1 to #5).

Referring to FIGS. 1 to 6, each of the first to fifth memory chips 100a to 100e may simultaneously receive or output zero-th to seventh data signals DQ0 to DQ7.

Any one of the first to fifth memory chips 100a to 100e, such as for example, the first memory chip 100a, may successively receive or output the zero-th to seventh data signal DQ0 to DQ7 by 16 times corresponding to the zero-th to fifteenth burst lengths BL0 to BL15. Therefore, a data block, which is a unit in which each of the first to fifth memory chips 100a to 100e exchanges data with the external host device, may be 128 bits.

A memory module 10 shown in FIG. 1 includes four raw data memory chips 100a to 100d. Therefore, the memory module 10 may exchange data with a controller 20 in a unit of 512 bits. In another embodiment, when the memory module includes 8 row data memory chips, the memory module may exchange data with the controller in a unit of 1024 bits.

Figure 7:
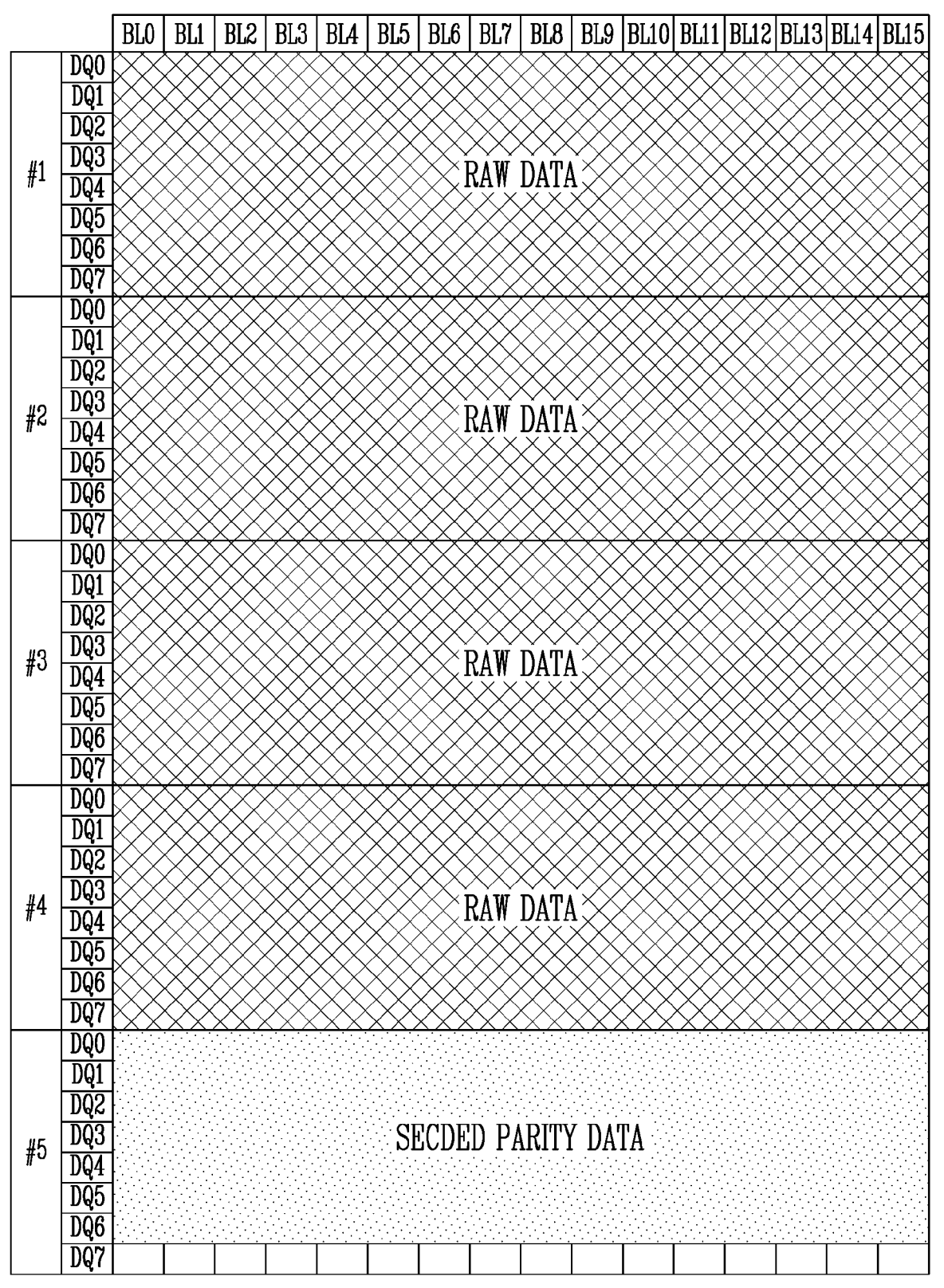

FIG. 7 is a diagram illustrating a type of data stored in each of first to fifth memory chips according to an embodiment of the present disclosure. Referring to FIG. 7, raw data is stored in first to fourth memory chips 100a to 100d. Meanwhile, data for error correction is stored in a fifth memory chip 100e.

Specifically, parity data for single error correction double error detection (SECDED) may be stored in the fifth memory chip 100e. In this case, the number ratio of the raw data memory chips 100a to 100d and the ECC memory chip 100e may be 4:1. Specifically, referring to FIG. 7, 7-bit SECDED parity data may be generated for 32-bit raw data of the first to fourth memory chips 100a to 100d corresponding to a burst length BL0. In addition, 7-bit SECDED parity data may be generated for 32-bit raw data of the first to fourth memory chips 100a to 100d corresponding to a burst length BL1. In summary, SECDED parity data for a total of 512 bits of raw data of the first to fourth memory chips 100a to 100d corresponding to the burst lengths BL0 to BL16 may be 112 bits. A remaining 16 bits of the fifth memory chip 100e may be allocated as a reserved region.

Figures 8, 9:
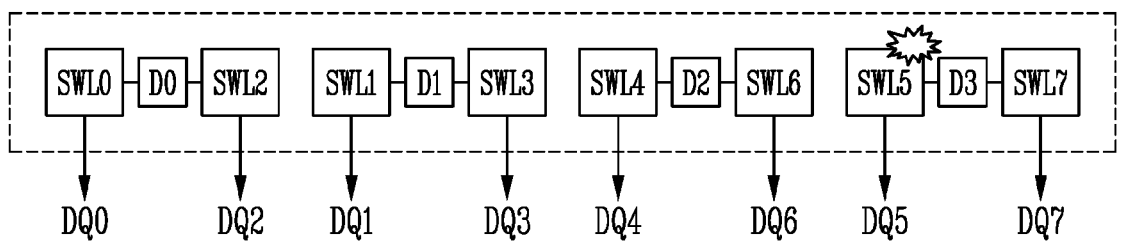
FIG. 8 is a diagram illustrating a sub-word line error occurring in a DQ octet mode according to an embodiment of the present disclosure.
FIG. 9 is a diagram illustrating an error of a data block illustrated in FIG. 8.

FIG. 8 is a diagram illustrating a sub-word line error occurring in a DQ octet mode according to an embodiment of the present disclosure. Meanwhile, FIG. 9 is a diagram illustrating an error of a data block illustrated in FIG. 8. In FIG. 9, for convenience of discussion, a portion of a data block corresponding to a first memory chip is shown. That is, among data blocks corresponding to a first memory chip, a portion corresponding to zero-th to seventh burst lengths BL0 to BL7 is shown.

Referring to FIG. 8, sub-word lines SWL0 to SWL7 are connected to drivers D0 to D3, respectively, and zero-th to seventh data signals DQ0 to DQ7 read from the respective sub-word lines SWL0 to SWL7 are shown. More specifically, the zero-th and second sub-word lines SWL0 and SWL2 are connected to the zero-th driver D0, the first and third sub-word lines SWL1 and SWL3 are connected to the first driver D1, the fourth and sixth sub-word lines SWL4 and SWL6 are connected to the second driver D2, and the fifth and seventh sub-word lines SWL5 and SWL7 are connected to the third driver D3. As illustrated in FIG. 8, an error may occur in data read from the fifth sub-word line SWL5.

Referring to FIG. 9, in the DQ octet mode, data read from the fifth sub-word line SWL5 becomes a row direction error corresponding to the fifth data signal DQ5. Accordingly, all data bits corresponding to the fifth data signal DQ5 may be error bits. In a data block portion shown in FIG. 9, an error bit is shown as hatched regions.

One error bit is included in each burst length. For example, since one error bit is included in data corresponding to the sixth burst length BL6, the error bit may be corrected using parity data stored in the fifth memory chip 100e. Since one error bit is also included in the other burst lengths BL0 to BL5 and BL7, the error bit may be corrected using the parity data stored in the fifth memory chip 100e. As described above, according to a data structure shown in FIG. 7, a bit error generated in the row direction may be easily detected and corrected.

Figures 10, 11:
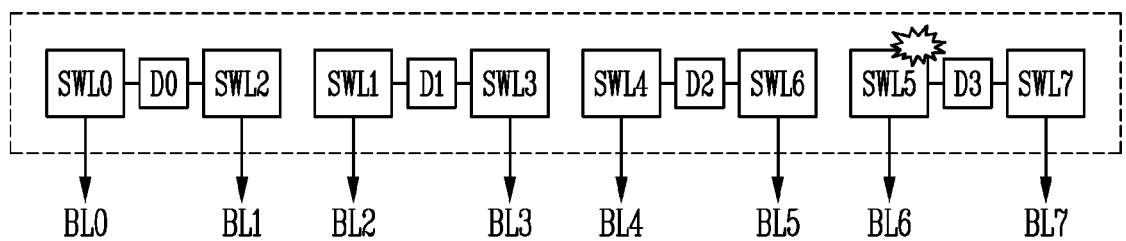
FIG. 10 is a diagram illustrating a sub-word line error occurs in a BL octet mode according to an embodiment of the present disclosure.
FIG. 11 is a diagram illustrating an error of a data block in FIG. 10.

FIG. 10 is a diagram illustrating a sub-word line error occurring in a BL octet mode according to an embodiment of the present disclosure. Meanwhile, FIG. 11 is a diagram illustrating an error of a data block in FIG. 10. In FIG. 10, for convenience of discussion, a portion of a data block corresponding to a first memory chip is shown. That is, among data blocks corresponding to the first memory chip, a portion corresponding to zero-th to seventh burst lengths BL0 to BL7 is shown.

Referring to FIG. 10, sub-word lines SWL0 to SWL7 are connected to drivers D0 to D3, respectively, and the zero-th to seventh burst lengths BL0 to BL7 read from the respective sub-word lines SWL0 to SWL7 are shown. More specifically, the zero-th and second sub-word lines SWL0 and SWL2 are connected to the zero-th driver D0, the first and third sub-word lines SWL1 and SWL3 are connected to the first driver D1, the fourth and sixth sub-word lines SWL4 and SWL6 are connected to the second driver D2, and the fifth and seventh sub-word lines SWL5 and SWL7 are connected to the third driver D3. FIG. 10 illustrates an error occurring in data read from the fifth sub-word line SWL5.

Referring to FIG. 11, in the BL octet mode, data read from the fifth sub-word line SWL5 becomes a column direction error corresponding to the sixth burst length BL6. Accordingly, all data bits corresponding to the sixth burst length BL6 may be error bits.

The error bit may not be corrected, however, using the parity data stored in the fifth memory chip 100e because up to eight error bits may be included in the data corresponding to the sixth burst length BL6. As described above, a data structure shown in FIG. 7 is very vulnerable to a bit error generated in the column direction.

According to an embodiment of the present disclosure, Reed-Solomon (RS) parity data is stored in a reserved region remaining after storing SECDED parity data, and the SECDED parity data is generated and stored based on the raw data and the RS parity data. The RS parity data is parity data used for a RS error correction operation. The RS error correction operation is an error correction method that corrects data in a symbol unit. According to the RS error correction operation, even though a plurality of error bits are included in a symbol included in a block which becomes a unit of error correction, all symbols in which an error bit occurs may be corrected. In the RS error correction operation, the number of correctable symbols may be determined by a size of the RS parity data.

Since the RS error correction operation is correction of the symbol unit, correcting successive errors occurring in some sub-word lines is facilitated when using the RS error correction operation. However, the RS error correction operation is vulnerable to correction of a randomly occurring bit error. According to the present disclosure, both of the RS error correction operation and the SECDED error correction operation are applicable. Therefore, both of a bit error of the column direction as well as a bit error of the row direction may be detected and corrected. Hereinafter, the present disclosure is described with reference to FIGS. 12 to 14.

Figure 12:
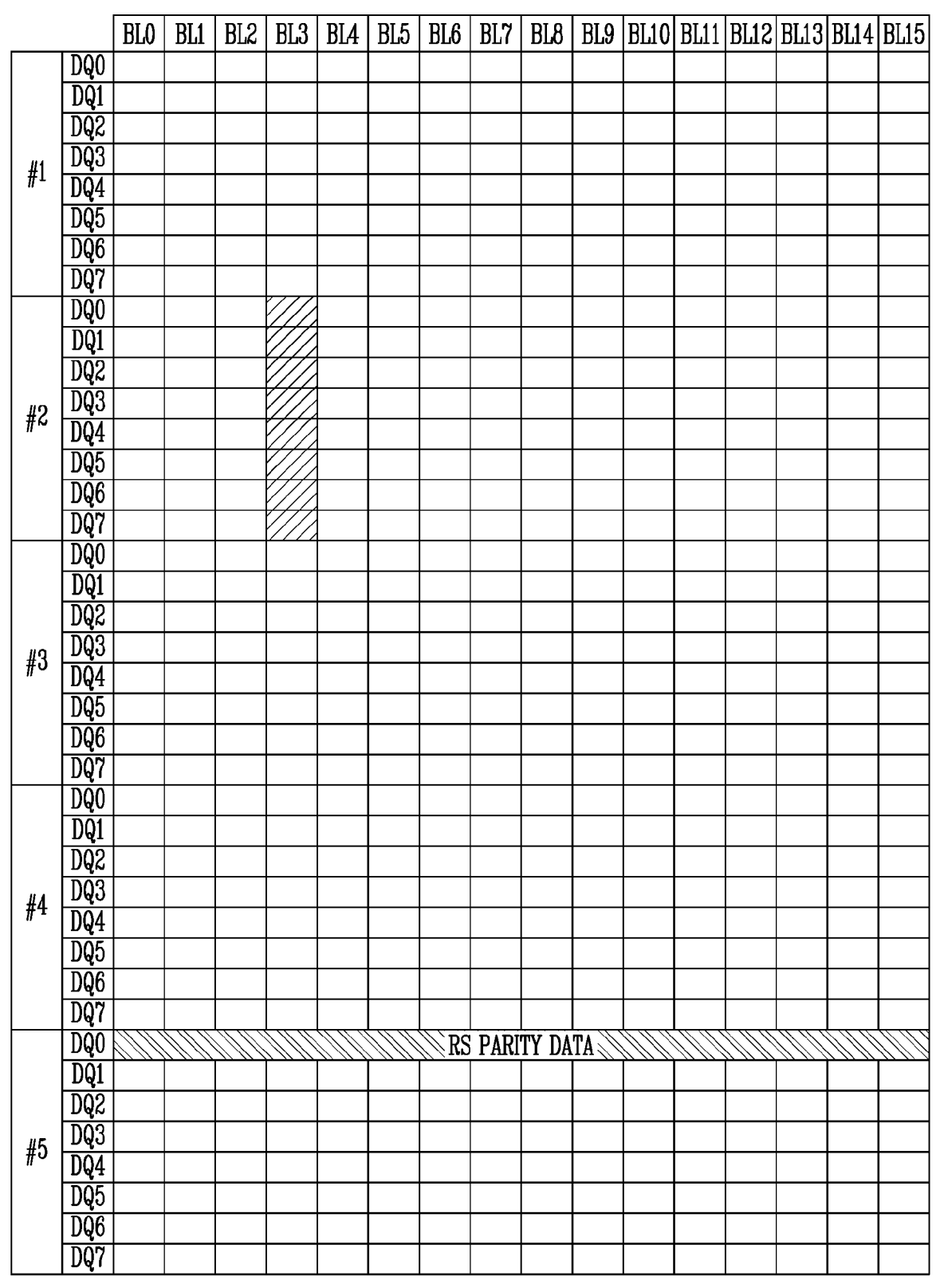

FIG. 12 is a diagram illustrating a process of generating and storing RS parity data in an ECC memory chip according to an embodiment of the present disclosure.

As described above with reference to FIG. 7, SECDED parity data for 512-bit raw data corresponding to four memory chips may be 112 bits, and thus, an extra 16 bits remain as a reserved region. According to the present disclosure, RS parity data is stored in the extra 16 bits of the reserved region.

In FIG. 12, exemplary symbol data is shown as a hatched region. That is, among bits of the second memory chip 100b, bits corresponding to a third burst length BL3 may configure one symbol. Therefore, data bits of a second memory chip 100b may configure a total of 16 symbols. As a result, first to fourth memory chips 100a to 100d may include a total of 64 symbols. According to an embodiment of the present disclosure, RS parity data for data configured of 64 symbols may be configured of two pieces of 8-bit parity data. That is, a size of RS parity data for 64 symbols is 16 bits. In FIG. 12, an RS parity data region may be a 16-bit region corresponding to a zero-th data signal DQ0 of a fifth memory chip 100e. FIG. 13, described below, illustrates the generation of the SECDED parity data.

FIG. 13 is a diagram illustrating a process of generating and storing SECDED parity data from raw data and RS parity data according to an embodiment of the present disclosure.

As described above with reference to FIG. 12, RS parity data is stored in a 16-bit region corresponding to a zero-th data signal DQ0 of a fifth memory chip 100e. Thereafter, based on a total of 512-bit raw data stored in first to fourth memory chips 100a to 100d and a 16-bit RS parity data stored in the fifth memory chip 100e, 112-bit SECDED parity data is generated. The generated SECDED parity data may be stored in an SECDED parity data region of the fifth memory chip 100e.

Specifically, 7-bit SECDED parity data may be generated with respect to 32-bit raw data of the first to fourth memory chips 100a to 100d corresponding to a burst length BL0, and 1-bit RS parity data of the fifth memory chip 100e may be generated corresponding to the burst length BL0. That is, 1-bit RS parity data for 33 bits is generated.

In addition, 7-bit SECDED parity data may be generated with respect to 32-bit raw data of the first to fourth memory chips 100a to 100d corresponding to a burst length BL1, and 1-bit RS parity data of the fifth memory chip 100e may be generated corresponding to the burst length BL0. In such a method, 7-bit SECDED parity data corresponding to each burst length may be generated. In FIG. 13, the SECDED parity data region is a 112-bit region corresponding to the first to seventh data signals DQ1 to DQ7 of the fifth memory chip 100e.

FIG. 14 is a diagram illustrating data stored in each memory chip of a memory module according to an embodiment of the present disclosure. Referring to FIG. 14, raw data is stored in first to fourth memory chips 100a to 100d among first to fifth memory chips 100a to 100e included in a memory module. RS parity data and SECDED parity data are stored in the fifth memory chip 100e.

When a row error as illustrated in FIG. 8 occurs, a bit error generated in the row direction may be detected and corrected using the SECDED parity data. When the column error shown in FIG. 10 occurs, the bit error generated in the column direction may be detected and corrected using the RS parity data. More specifically, when a symbol error occurs in the column direction as shown in FIGS. 10 and 11, the symbol error may be detected and corrected using the RS parity data.

What is claimed is:

1. A memory module comprising:
   a plurality of first memory chips configure to store raw data; and
   a second memory chip configure to store parity data generated using the raw data,
   a controller configured to exchange data with each of the first memory chips and the second memory chip in burst length units, and
   wherein the second memory chip stores a first parity data generated from the raw data, and to store a second parity data generated from the raw data and the first parity data, and
   wherein the first parity data and the second parity data are generated using different error correction codes.

2. The memory module of claim 1, wherein the first parity data is generated using a Reed-Solomon (RS) code.

3. The memory module of claim 2, wherein the second parity data is generated using a single error correction double error detection (SECDED) method.

4. The memory module according to claim 3, wherein the number of the first memory chips is 4.

5. The memory module according to claim 4, wherein each of the first memory chips and the second memory chip is configured to simultaneously output eight bits.

6. The memory module of claim 5, wherein the first parity data includes parity bits generated using the Reed-Solomon (RS) code from four symbols, each symbol including 8 bits.

7. The memory module of claim 6, wherein the second parity data includes second to eighth parity bits generated using the single error correction double error detection (SECDED) method applied to the four symbols and the parity bits.

8. The memory module of claim 7, wherein each of the first memory chips and the second memory chip comprises:
   a plurality of banks;
   a peripheral circuit configured to receive a command and an address from the controller, transfer the command and the address to the plurality of banks, and exchange data between the controller and the plurality of banks, and
   each of the plurality of banks comprises:
   a memory cell array including a plurality of memory cells;
   a row decoder connected to the plurality of memory cells through word lines;
   bit line sense amplifiers connected to the plurality of memory cells through bit lines; and
   a column decoder configured to connect some of the bit line sense amplifiers with the peripheral circuit.

9. The memory module of claim 8, wherein the memory cell array includes a plurality of data blocks, and
   each of the plurality of data blocks includes 128 bits.

10. The memory module of claim 9, wherein each of the plurality of data blocks included in the second memory chip comprises:
    a first parity data region in which the first parity data is stored; and
    a second parity data region in which the second parity data is stored.

11. The memory module of claim 10, wherein a ratio of the first parity data region to the second parity data region is 1:7.

12. The memory module of claim 11, wherein the first parity data region is 16 bits and the second parity data region is 112 bits.

* * * * *